United States Patent
Poe

(10) Patent No.: US 9,399,901 B2
(45) Date of Patent: Jul. 26, 2016

(54) CHARACTERIZING FLOW PRODUCTION

(75) Inventor: Bobby D. Poe, Houston, TX (US)

(73) Assignee: Schlumberger Technology Corporation, Sugar Land, TX (US)

(*) Notice: Subject to any disclaimer, the term of this patent is extended or adjusted under 35 U.S.C. 154(b) by 646 days.

(21) Appl. No.: 12/914,359

(22) Filed: Oct. 28, 2010

(65) Prior Publication Data

US 2011/0307227 A1 Dec. 15, 2011

Related U.S. Application Data

(60) Provisional application No. 61/354,976, filed on Jun. 15, 2010.

(51) Int. Cl.
```
G06G 7/48    (2006.01)
E21B 43/00   (2006.01)
E21B 43/12   (2006.01)
E21B 47/00   (2012.01)
G06F 17/50   (2006.01)
```
(52) U.S. Cl.
CPC .............. *E21B 43/00* (2013.01); *E21B 43/12* (2013.01); *E21B 47/00* (2013.01); *G06F 17/50* (2013.01)

(58) Field of Classification Search
CPC ......... E21B 43/00; E21B 43/12; E21B 43/25; E21B 43/16; E21B 47/00; G06F 17/50
USPC .............................................. 703/10, 2, 6, 9
See application file for complete search history.

(56) References Cited

U.S. PATENT DOCUMENTS

| | | | |
|---|---|---|---|
| 6,101,447 A | 8/2000 | Poe, Jr. | |
| 6,266,619 B1 | 7/2001 | Thomas et al. | |
| 2003/0225522 A1* | 12/2003 | Poe | 702/11 |

FOREIGN PATENT DOCUMENTS

EA 006215 B1 10/2005

OTHER PUBLICATIONS

Poe Jr., B.D., "Production Diagnostic Analyses with Incomplete or No Pressure Records", Oct. 5-8, 2003, SPE Annual Technical Conference and Exhibition, Society of Petroleum Engineers.*
Gentry, R.W. et al., "The Effect of Reservoir and Fluid Properties on Production Decline Curves", Sep. 1978, Journal of Petroleum Technology, Society of Petroleum Engineers of AIME.*
Doublet, L.E. et al., "Decline Curve Analysis Using Type Curves—Analysis of Oil Well Production Data Using Material Balance Time: Application to Field Cases", Oct. 10-13, 1994, Petroleum Conference and Exhibition of Mexico, Society of Petroleum Engineers.*
Pratikno, H. et al. "Decline Curve Analysis Using Type Curves—Fractured Wells", Oct. 5-8, 2003, SPE Annual Technical Conference and Exhibition, Society of Petroleum Engineers, Inc.*
Camacho-Velazquez, R. et al., "Pressure Transient and Decline Curve Behaviors in Naturally Fractured Vuggy Carbonate Reservoirs", Sep. 29-Oct. 3, 2002, SPE Annual Technical Conference and Exhibition, Society of Petroleum Engineers.*

(Continued)

*Primary Examiner* — Kamini S Shah
*Assistant Examiner* — Cedric D Johnson
(74) *Attorney, Agent, or Firm* — Rodney Warfford; Gary Gex

(57) ABSTRACT

A method for characterizing flow production of a well. The method includes generating a plurality of dimensionless decline curves from a mathematical model that characterizes an expected flow production of the well and generating an overlay curve based on production data pertaining to the well. After generating the mathematical model and the overlay curve, the method compares the overlay curve to the plurality of dimensionless decline curves. The method then calculates a reservoir effective drainage area for the well based on the comparison.

20 Claims, 7 Drawing Sheets

(56) References Cited

OTHER PUBLICATIONS

Poon, D.C., "Decline Curves for Predicting Production Performance from Horizontal Wells", Jan.-Feb. 1991, CIM/SPE Annual Technical Conference.*

Palacio, J.C. and Blasingame, T.A. 1993. "Decline-Curve Analysis Using Type Curves—Analysis of Gas Well Production Data," paper SPE 25909 presented at the SPE Rocky Mountain Regional / Low Permeability Reservoirs Symposium, Denver, Apr. 12-14 DOI: 10.2118/25909-MS.

Doublet, L.E., Pande, P.K., McCollum, T.J., and Blasingame, T.A. 1994. "Decline Curve Analysis Using Type Curves—Analysis of Oil Well Production Data Using Material Balance Time: Application to Field Cases," paper SPE 28688 presented at the SPE International Petroleum Conference and Exhibition of Mexico, Veracruz, Mexico, Oct. 10-13 DOI: 10.2118/28688-MS.

Doublet, L.E. and Blasingame, T.A. 1995. "Evaluation of Injection Well Performance Using Decline Type Curves," paper SPE 35205 presented at the SPE Permian Basin Oil and Gas Recovery Conference, Midland, Texas, Mar. 27-29, 1996.

Doublet, L.E. and Blasingame, T.A. 1995. "Decline Curve Analysis Using Type Curves: Water Influx / Waterflood Cases," paper 30774 presented at the ATCE, Dallas, Oct. 22-25.

Shih, M.Y. and Blasingame, T.A. 1995. "Decline Curve Analysis Using Type Curves: Horizontal Wells," paper SPE 29572 presented at the SPE Joint Rocky Mountain / Low Permeability Reservoirs Symposium, Denver, Mar. 19-22.

Horner, D.R. 1951. "Pressure Build-up in Wells," Proc., Third World Petroleum Congress, The Hague, II: 503.

Poe, B. D. Jr., Poston, S. W., "Evaluation of Time to Flow Stabilization and Effective Drainage Area of Slow-Stabilizing Wells Using Production Decline Analysis", SPE Paper 135475 presented at the SPE Annual Technical Conference and Exhibition held in Florence, Italy, Sep. 19-22, 2010.

EA Search Report for corresponding EA Application No. 201100780 filed Jun. 14, 2011.

Li, Kewen et al.; "A Decline Curve Analysis Model Based on Fluid Flow Mechanisms," SPE 83470; Western Regional/AAPG Pacific Section Joint Meeting held in Long Beach, California, U.S.A., May 19-24, 2003.

Blasingame, T.A. et al.; "A Production-Based Method for Direct Estimation of Gas-in-Place and Reserves," SPE98042; SPE Eastern Regional Meeting held in Morgantown, W.V., Sep. 14-16, 2005.

Ozkan, E., "Performance of Horizontal Wells", PhD Dissertation, The University of Tulsa, The Graduate School, 1988, 124 pgs.

Fetkovich, M.J., "Decline Curve Analysis Using Type Curves", SPE 48th Fall Meeting, Las Vegas, Sep. 30-Oct 3, 1973, 13 pgs.

CA 2737572, Examination Search Report, dated Apr. 29, 2016, 4 pgs.

* cited by examiner

600

CHARACTERIZING FLOW PRODUCTION

RELATED APPLICATIONS

This application claims priority to U.S. provisional patent application Ser. No. 61/354,976 filed Jun. 15, 2010, titled METHOD FOR EVALUATING TIME TO FLOW STABILIZATION AND EFFECTIVE DRAINAGE AREA OF SLOW STABILIZING WELLS USING PRODUCTION DECLINE CURVE ANALYSES, which is incorporated herein by reference.

BACKGROUND

1. Field of the Invention

Implementations of various technologies described herein generally relate to techniques for characterizing a flow production of a well and, more particularly, to techniques for generating characteristics describing the production performance of a well.

2. Description of the Related Art

The following descriptions and examples are not admitted to be prior art by virtue of their inclusion within this section.

The estimation of a reservoir's drainage area, the hydrocarbons-initially-in-place in the area, and the production time required to observe reservoir boundary effects in the production performance of any reservoir is of great interest to reservoir and production engineers, reserves analysts, financial institutions and investors. Traditionally, the estimation of a reservoir's drainage area, the hydrocarbons-initially-in-place in the area, and the production time required to observe reservoir boundary effects is determined by matching the well production performance data to a decline curve, estimated using a decline curve analysis technique (e.g., Fetkovich).

In order to obtain a reasonably unique match of the well production performance data to the estimated decline curve using traditional analysis techniques, the well production data should include both transient and boundary-dominated flow well performance data. However, certain reservoirs, such as those that are low permeability, heterogeneous, layered or naturally fractured, may require a long production time to reach the stabilized boundary-dominated flow regime of the well. In some cases, it could be years or decades before the production time reaches the stabilized boundary-dominated flow regime of the well. Therefore, there is a need to find a new method to find a unique match of the well production performance data to the estimated decline curve without the use of boundary-dominated flow well performance data.

Additionally, even if well production data include both transient and boundary-dominated flow well performance data, traditional decline curve analysis techniques use derivative or integral-derivative functions to analyze the well production data. Typically, however, the well production data include noise, and as such, the use of derivative or integral-derivative functions to analyze the well production data result in a further magnification of the noise and require arbitrary smoothing techniques that are not grounded in sound statistical or engineering principles. As a result, the resulting decline curve may be inaccurate.

SUMMARY

Described herein are implementations of various techniques for characterizing production performance properties of a well. In one implementation, a method for characterizing flow production of a well may include generating a plurality of dimensionless decline curves from a mathematical model that characterizes an expected flow production of the well and generating an overlay curve based on production data pertaining to the well. After generating the mathematical model and the overlay curve, the method compares the overlay curve to the plurality of dimensionless decline curves. The method then calculates a reservoir effective drainage area for the well based on the comparison.

In another implementation, the method may include determining a plurality of rate transient functions that correspond to a mathematical model. The mathematical model may characterize an expected flow production of a well. The method may then determine an imaging function that corresponds to the mathematical model and determine a plurality of decline analysis functions based on the plurality of rate transient functions and the imaging function. After determining the plurality of decline analysis functions, the method may plot a plurality of dimensionless decline curves based on the plurality of decline analysis functions. The method may then generate an overlay curve based on production data pertaining to the well, compare the overlay curve to the plurality of dimensionless decline curves, and calculate a reservoir effective drainage area for the well based on the comparison.

In yet another implementation, the method may include generating a plurality of dimensionless decline curves from a mathematical model that characterizes an expected flow production of the well. The method may then generate an overlay curve based on production data pertaining to the well. After generating the overlay curve, the method may fit the overlay curve onto the plurality of dimensionless decline curves such that the overlay curve matches one of the plurality of dimensionless decline curves. The method may then identify a match point on the fitted overlay curve and determine one or more values from the one of the plurality of dimensionless decline curves and the overlay curve that correspond to the match point. After determining the values, the method may calculate a reservoir effective drainage area for the well based on the values from the one of the plurality of dimensionless decline curves and the overlay curve The claimed subject matter is not limited to implementations that solve any or all of the noted disadvantages. Further, the summary section is provided to introduce a selection of concepts in a simplified form that are further described below in the detailed description section. The summary section is not intended to identify key or essential features of the claimed subject matter, nor is it intended to be used to limit the scope of the claimed subject matter.

BRIEF DESCRIPTION OF THE DRAWINGS

Implementations of various technologies will hereafter be described with reference to the accompanying drawings. It should be understood, however, that the accompanying drawings illustrate only the various implementations described herein and are not meant to limit the scope of various technologies described herein.

DETAILED DESCRIPTION

The discussion below is directed to certain specific implementations. It is to be understood that the discussion below is only for the purpose of enabling a person with ordinary skill in the art to make and use any subject matter defined now or later by the patent "claims" found in any issued patent herein.

The following provides a brief description of various technologies and techniques for characterizing a flow production of a well. In one implementation, a computer application may receive information pertaining to a well. Based on the information pertaining to the well, the computer application may identify a mathematical model that corresponds to the well. The computer application may then generate dimensionless decline curves for the well from the mathematical model. In order to generate the dimensionless decline curves, the computer application may first calculate rate transient functions for the well based on the mathematical model. The computer application may then calculate an imaging function for the well based on the mathematical model, the well's position in the reservoir and the shape of the reservoir. Using the rate transient functions for the well model and the imaging function for the well model, the computer application may calculate decline analysis functions. After determining the decline analysis functions, the computer application may plot the decline analysis functions on a graph to generate the dimensionless decline curves.

The computer application may then receive production data from the well that is being analyzed. Production data may include production logs, well logs, wireline logs and the like. The computer application may prepare the production data into a proper format, such as an overlay curve, that can be mapped to the dimensionless decline curves.

The computer application may then fit the overlay curve onto the dimensionless decline curves such that the overlay curve matches one of the dimensionless decline curves. Based on the match between the overlay curve and the dimensionless decline curve, the computer application may identify a match point on the fitted overlay curve. The computer application may then determine the corresponding values on the overlay curve's grid and the dimensionless decline curves' grid for the match point.

Using the corresponding values on the overlay curve's grid and the dimensionless decline curves' grid at the match point, the computer application may calculate a reservoir effective drainage area associated with the well. The computer application may then calculate reservoir and well completion data and well completion effectiveness parameters in a systematic manner using the calculated reservoir effective drainage area associated with the well.

FIGS. 1-6 illustrate one or more implementations of various techniques described herein in more detail.

Figure 1:
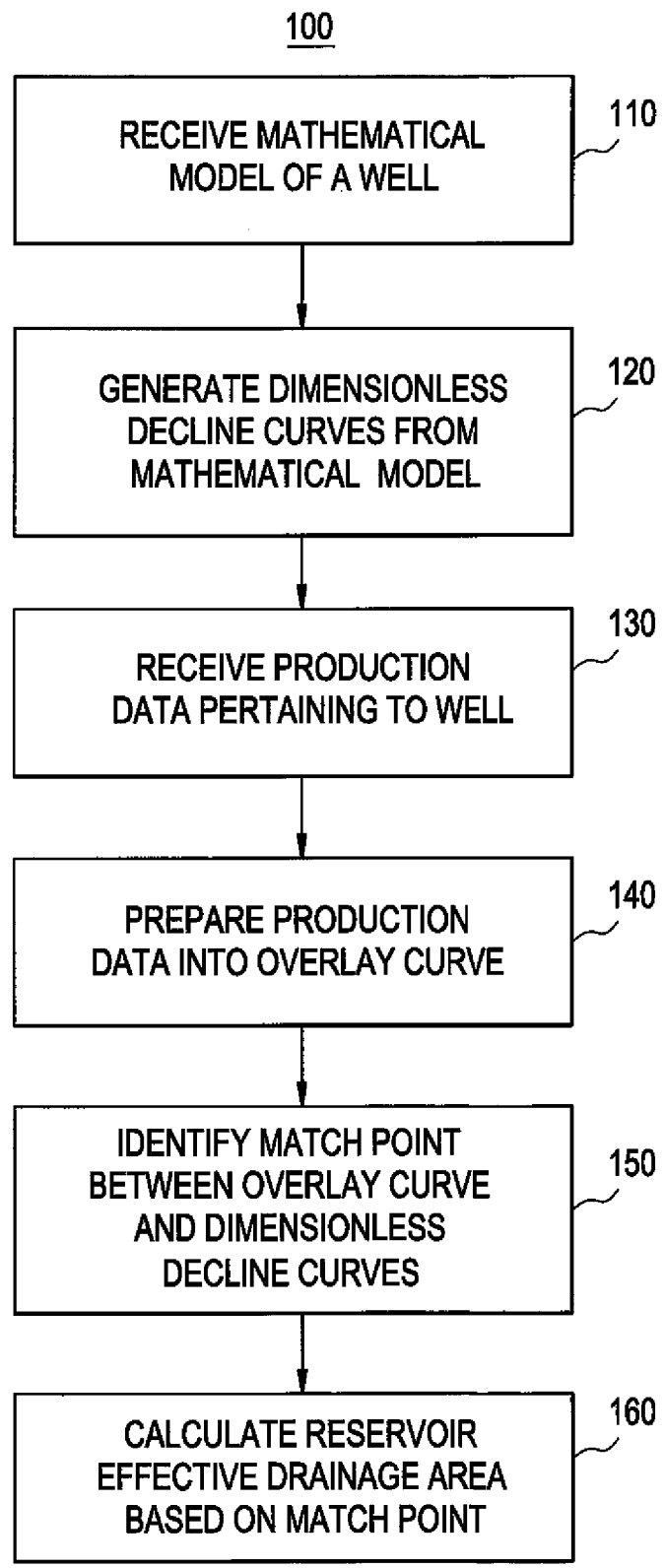
FIG. 1 illustrates a flow diagram of a method for characterizing a flow production of a well in accordance with implementations of various techniques described herein.
Figure 2:
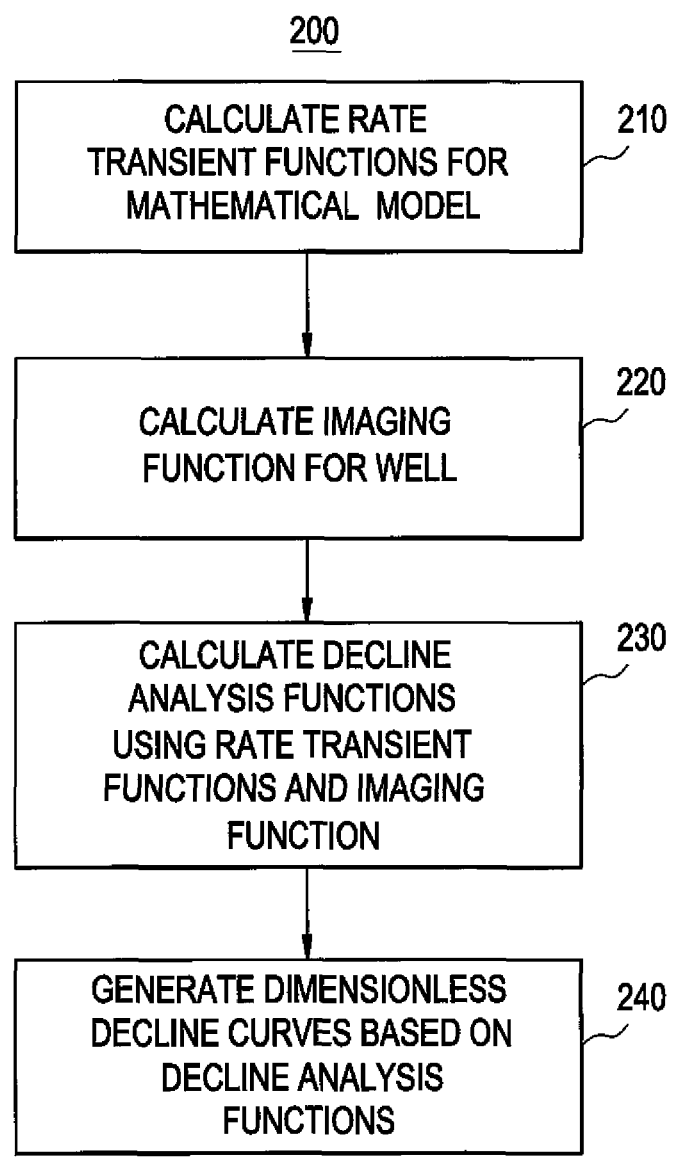
FIG. 2 illustrates a flow diagram of a method for generating dimensionless decline curves of a well in accordance with implementations of various techniques described herein.

FIG. 1 illustrates a flow diagram of a method for characterizing a flow production of a well in accordance with implementations of various techniques described herein. In one implementation, method 100 may be performed by a computer application. It should be understood that while method 100 indicates a particular order of execution of the operations, in some implementations, certain portions of the operations might be executed in a different order.

At step 110, the computer application may receive a mathematical model of a well that is to be analyzed. The mathematical model may be based on information pertaining to the well, which may describe the various characteristics of the well. For example, the information pertaining to the well may include whether the well is an oil well or a gas well, whether the well is fractured or unfractured, whether the well is vertical or horizontal, and the like. Examples of various types of wells include an unfractured vertical well, a finite-conductivity vertical fracture well, an infinite conductivity horizontal well and the like. For illustrative purposes, the remaining description of method 100 will be discussed with reference to an infinite conductivity horizontal well. However, it should be understood that method 100 is not limited to an infinite conductivity horizontal well; instead, method 100 may be applied to any type of well. The infinite conductivity horizontal well is discussed with reference to method 100 merely to serve as an example and to assist in understanding how method 100 may be used.

The mathematical model may illustrate the expected production performance of the well based on various mathematical equations. For instance, the mathematical model may illustrate properties for evaluating the production performance of oil or gas wells based on Laplace domain pressure-transient solutions for an infinite conductivity horizontal wellbore in a closed rectangle drainage area. In one implementation, the computer application may identify the mathematical model of the well based on information pertaining to the well that may be received from a user.

At step 120, the computer application may generate dimensionless decline curves for the well from the mathematical model. The process for generating dimensionless decline curves is described with reference to FIG. 2. In order to generate the dimensionless decline curves, the computer application may first calculate rate transient functions for the well based on the mathematical model. (See step 210). Rate-transient functions may include: $t_D$ (dimensionless time), $q_{wD}$ (dimensionless wellbore flow rate solution) and $Q_{pD}$ (dimensionless rate-transient well cumulative production).

In one implementation, the rate-transient functions for an infinite conductivity horizontal well may be evaluated in a closed rectangle to construct production decline curves. Evaluating these rate-transient functions, however, may require special computational considerations. For instance, some of the computations for the infinite conductivity horizontal well may include a computation of the infinite conductivity vertical fracture well component of the horizontal well solution and a computation of the additional imaging components for the horizontal well solution.

A second computational consideration may include improving the rate of convergence of the imaging series in the rate-transient functions by recasting the rate-transient functions into a more computable format. For instance, a Laplace domain wellbore pressure-transient solution for a uniform flux vertical fracture in a rectangle component that is used to compute a part of the horizontal well solution is provided below in Equation 1 in a form which can be used to readily compute the uniform flux or infinite conductivity vertical fracture response for dimensionless time values with respect to a drainage area greater than or equal to 0.01 (i.e., $t_{DA} \geq 0.01$). In this manner, the infinite conductivity response may be evaluated using the uniform flux solution given in Equation 1 by evaluating the solution at the spatial position given by $X_D=X_{wD}+0.732$ at the fracture face ($Y_D=Y_{wD}$).

(Equation 1)
$$\tilde{P}_{Df}(s) = \frac{\pi}{X_{eD}s\sqrt{sf(s)}}\left[1+\exp\left(-2\sqrt{sf(s)}\,Y_{eD}\right)+\exp\left(-2\sqrt{sf(s)}\,Y_{wD}\right)+\right.$$
$$\left.\exp\left(-2\sqrt{sf(s)}\,(Y_{eD}-Y_{wD})\right)\right]\left[1+\sum_{m=1}^{\infty}\exp\left(-2m\sqrt{sf(s)}\,Y_{eD}\right)\right]+$$
$$\frac{2}{s}\sum_{n=1}^{\infty}\frac{\sin\left(\frac{n\pi}{X_{eD}}\right)\cos\left(\frac{n\pi X_{wD}}{X_{eD}}\right)\cos\left(\frac{n\pi X_D}{X_{eD}}\right)}{n\sqrt{sf(s)+\frac{n^2\pi^2}{X_{eD}^2}}}$$
$$\left[1+\exp\left(-2\sqrt{sf(s)+\frac{n^2\pi^2}{X_{eD}^2}}\,Y_{eD}\right)+\right.$$
$$\exp\left(-2\sqrt{sf(s)+\frac{n^2\pi^2}{X_{eD}^2}}\,Y_{wD}\right)+$$
$$\left.\exp\left(-2\sqrt{sf(s)+\frac{n^2\pi^2}{X_{eD}^2}}\,(Y_{eD}-Y_{wD})\right)\right]\cdot$$
$$\left[1+\sum_{m=1}^{\infty}\exp\left(-2m\sqrt{sf(s)+\frac{n^2\pi^2}{X_{eD}^2}}\,Y_{eD}\right)\right]$$

For early transient times (i.e., $t_{DA}<0.01$), the vertical fracture pressure-transient solution given in Equation 1 may be recast into a more readily computable format to improve the convergence of the imaging series. The vertical fracture pressure-transient solution may be recast as a sum of components for a vertical fracture in an infinite-acting reservoir and bounded reservoir components as per the boundary region. The resulting solution for a vertical fracture in a closed rectangle is defined as given in Equations 2-5.

(Equation 2)
$$\tilde{P}_{Df}(s) = \frac{1}{2s\sqrt{sf(s)}}\left[\int_0^{\sqrt{sf(s)}\,(1+X_D^*)}K_0(u)du+\int_0^{\sqrt{sf(s)}\,(1-X_D^*)}K_0(u)du\right]+$$
$$\tilde{P}_{Db1}+\tilde{P}_{Db2}+\tilde{P}_{Db3}$$

(Equation 3)
$$\tilde{P}_{Db1} = \frac{\pi}{X_{eD}s\sqrt{sf(s)}}\left[1+\exp\left(-2\sqrt{sf(s)}\,Y_{eD}\right)+\exp\left(-2\sqrt{sf(s)}\,Y_{wD}\right)+\right.$$
$$\left.\exp\left(-2\sqrt{sf(s)}\,(Y_{eD}-Y_{wD})\right)\right]\left[1+\sum_{m=1}^{\infty}\exp\left(-2m\sqrt{sf(s)}\,Y_{eD}\right)\right]$$

(Equation 4)
$$\tilde{P}_{Db2} = \frac{2}{s}\sum_{n=1}^{\infty}\frac{\sin\left(\frac{n\pi}{X_{eD}}\right)\cos\left(\frac{n\pi X_{wD}}{x_{leD}}\right)\cos\left(\frac{n\pi X_D}{X_{eD}}\right)}{n\sqrt{sf(s)+\frac{n^2\pi^2}{X_{eD}^2}}}$$
$$\left\{\left[\exp\left(-2\sqrt{sf(s)+\frac{n^2\pi^2}{X_{eD}^2}}\,Y_{eD}\right)+\exp\left(-2\sqrt{sf(s)+\frac{n^2\pi^2}{X_{eD}^2}}\,Y_{wD}\right)+\right.\right.$$
$$\left.\left.\exp\left(-2\sqrt{sf(s)+\frac{n^2\pi^2}{X_{eD}^2}}\,(Y_{eD}-Y_{wD})\right)\right]\cdot\right.$$

-continued
$$\left[1+\sum_{m=1}^{\infty}\exp\left(-2m\sqrt{sf(s)+\frac{n^2\pi^2}{X_{eD}^2}}\,Y_{eD}\right)\right]+$$
$$\left.\sum_{m=1}^{\infty}\exp\left(-2m\sqrt{sf(s)+\frac{n^2\pi^2}{X_{eD}^2}}\,Y_{eD}\right)\right\}$$

(Equation 5)
$$\tilde{P}_{Db3} = \frac{1}{2s\sqrt{sf(s)}}\left\{\int_0^{\sqrt{sf(s)}\,(X_D+X_{wD}+1)}K_0(u)du-\right.$$
$$\int_0^{\sqrt{sf(s)}\,(X_D+X_{wD}-1)}K_0(u)du+$$
$$\sum_{n=1}^{\infty}\left[\int_0^{\sqrt{sf(s)}\,(2nX_{eD}-X_D+X_{wD}+1)}K_0(u)du-\right.$$
$$\int_0^{\sqrt{sf(s)}\,(2nX_{eD}-X_D+X_{wD}-1)}K_0(u)du+$$
$$\int_0^{\sqrt{sf(s)}\,(2nX_{eD}+X_D-X_{wD}+1)}K_0(u)du-$$
$$\int_0^{\sqrt{sf(s)}\,(2nX_{eD}+X_D-X_{wD}-1)}K_0(u)du+$$
$$\int_0^{\sqrt{sf(s)}\,(2nX_{eD}-X_D-X_{wD}+1)}K_0(u)du-$$
$$\int_0^{\sqrt{sf(s)}\,(2nX_{eD}-X_D-X_{wD}-1)}K_0(u)du+$$
$$\int_0^{\sqrt{sf(s)}\,(2nX_{eD}+X_D+X_{wD}+1)}K_0(u)du-$$
$$\left.\left.\int_0^{\sqrt{sf(s)}\,(2nX_{eD}+X_D+X_{wD}-1)}K_0(u)du\right]\right\}-\frac{\pi}{X_{eD}s\sqrt{sf(s)}}$$

The next step in the computation of the rate-transient functions for an infinite conductivity horizontal well in a rectangular region may include the evaluation of the additional imaging components that are specific to the horizontal well solution and that are not part of the vertically fractured well solution. For late dimensionless times ($t_{DA}\geq0.01$), the wellbore pressure transient behavior of an infinite conductivity horizontal well in a closed rectangle is given by Equations 6 and 7, where the vertical fracture component is given in Equation 1 above.

(Equation 6)
$$\tilde{P}_{Dh}(s) = \tilde{P}_{Df} + \tilde{F}_1$$

(Equation 7)
$$\tilde{F}_1 = \frac{2\pi}{X_{eD}s}\sum_{n=1}^{\infty}\frac{\cos(n\pi Z_{wD})\cos(n\pi Z_D)}{\sqrt{sf(s)+n^2\pi^2 L_D^2}}$$
$$\left[1+\exp\left(-2\sqrt{sf(s)+n^2\pi^2 L_D^2}\,Y_{eD}\right)+\exp\left(-2\sqrt{sf(s)+n^2\pi^2 L_D^2}\,Y_{wD}\right)+\right.$$
$$\left.\exp\left(-2\sqrt{sf(s)+n^2\pi^2 L_D^2}\,(Y_{eD}-Y_{wD})\right)\right]\cdot$$
$$\left[1+\sum_{m=1}^{\infty}\exp\left(-2m\sqrt{sf(1s)+n^2\pi^2 L_D^2}\,Y_{eD}\right)\right]+$$

$$\frac{8}{s}\sum_{n=1}^{\infty}\cos(n\pi Z_{wD})\cos(n\pi Z_D)\cdot$$

$$\sum_{j=1}^{\infty}\frac{\sin\left(\frac{j\pi}{X_{eD}}\right)\cos\left(\frac{j\pi X_{wD}}{X_{eD}}\right)\cos\left(\frac{j\pi X_D}{X_{eD}}\right)}{j\sqrt{sf(s)+n^2\pi^2 L_D^2+\frac{j^2\pi^2}{X_{eD}^2}}}$$

$$\left[1+\exp\left(-2\sqrt{sf(s)+n^2\pi^2 L_D^2+\frac{j^2\pi^2}{X_{eD}^2}}\,Y_{eD}\right)+\right.$$

$$\exp\left(-2\sqrt{sf(s)+n^2\pi^2 L_D^2+\frac{j^2\pi^2}{X_{eD}^2}}\,Y_{wD}\right)+$$

$$\left.\exp\left(-2\sqrt{sf(s)+n^2\pi^2 L_D^2+\frac{j^2\pi^2}{X_{eD}^2}}\,(Y_{eD}-Y_{wD})\right)\cdot 1+\sum_{m=1}^{\infty}\exp\left(-2m\sqrt{sf(s)+n^2\pi^2 L_D^2+\frac{j^2\pi^2}{X_{eD}^2}}\,Y_{eD}\right)\right]$$

For early transient times ($t_{DA} < 0.01$), the pressure-transient solution for an infinite conductivity horizontal well may be recast into the form given by Equation 6 to improve the computational efficiency and the accuracy of the solution, in which the component of the solution that is identical to that of a vertically fractured well is given by Equations 2-5 and the imaging component that is specific only to the horizontal well solution is given by Equations 8-12.

(Equation 8)
$$\tilde{F}_1 = \tilde{F} + \tilde{F}_{b1} + \tilde{F}_{b2} + \tilde{F}_{b3}$$

(Equation 9)
$$\tilde{F} = \frac{1}{2L_D s}\left\{K_0\left(\frac{|Z_D - Z_{wD}|\sqrt{sf(s)}}{L_D}\right)+\right.$$

$$K_0\left(\frac{|Z_D + Z_{wD}|\sqrt{sf(s)}}{L_D}\right) + \sum_{n=1}^{\infty}\left[K_0\left(\frac{|Z_D - Z_{wD} - 2n|\sqrt{sf(s)}}{L_D}\right)+\right.$$

$$K_0\left(\frac{|Z_D + Z_{wD} - 2n|\sqrt{sf(s)}}{L_D}\right) + K_0\left(\frac{|Z_D - Z_{wD} + 2n|\sqrt{sf(s)}}{L_D}\right) +$$

$$\left.\left.K_0\left(\frac{|Z_D + Z_{wD} + 2n|\sqrt{sf(s)}}{L_D}\right)\right] - \frac{\pi}{2s\sqrt{sf(s)}} - \right.$$

$$\frac{1}{s}\sum_{n=1}^{\infty}\frac{\cos(n\pi Z_{wD})\cos(n\pi Z_D)}{\sqrt{sf(s)+n^2\pi^2 L_D^2}}$$

$$\left\{K_{i1}\left[\sqrt{sf(s)+n^2\pi^2 L_D^2}\,(1-X_D+X_{wD})\right]+\right.$$

$$\left.K_{i1}\left[\sqrt{sf(s)+n^2\pi^2 L_D^2}\,(1+X_D-X_{wD})\right]\right\}\right\}$$

(Equation 10)
$$\tilde{F}_{b1} = \frac{2\pi}{X_{eD}s}\sum_{n=1}^{\infty}\frac{\cos(n\pi Z_{wD})\cos(n\pi Z_D)}{\sqrt{sf(s)+n^2\pi^2 L_D^2}}$$

$$\left\{\left[\exp\left(-2\sqrt{sf(s)+n^2\pi^2 L_D^2}\,Y_{eD}\right)+\right.\right.$$

$$\exp\left(-2\sqrt{sf(s)+n^2\pi^2 L_D^2}\,Y_{wD}\right)+$$

$$\exp\left(-2\sqrt{sf(s)+n^2\pi^2 L_D^2}\,(Y_{eD}-Y_{wD})\right)\right]\cdot$$

$$\left[1+\sum_{m=1}^{\infty}\exp\left(-2m\sqrt{sf(s)+n^2\pi^2 L_D^2}\,Y_{eD}\right)\right]+$$

$$\left.\sum_{m=1}^{\infty}\exp\left(-2m\sqrt{sf(s)+n^2\pi^2 L_D^2}\,Y_{eD}\right)\right\}$$

(Equation 11)
$$\tilde{F}_{b2} = \frac{4}{s}\sum_{n=1}^{\infty}\cos(n\pi Z_{wD})\cos(n\pi Z_D)$$

$$\sum_{j=1}^{\infty}\frac{\sin\left(\frac{j\pi}{X_{eD}}\right)\cos\left(\frac{j\pi X_{wD}}{X_{eD}}\right)\cos\left(\frac{j\pi X_D}{X_{eD}}\right)}{j\sqrt{sf(s)+n^2\pi^2 L_D^2+\frac{j^2\pi^2}{X_{eD}^2}}}\cdot$$

$$\left\{\left[\exp\left(-2\sqrt{sf(s)+n^2\pi^2 L_D^2+\frac{j^2\pi^2}{X_{eD}^2}}\,Y_{eD}\right)+\right.\right.$$

$$\exp\left(-2\sqrt{sf(s)+n^2\pi^2 L_D^2+\frac{j^2\pi^2}{X_{eD}^2}}\,Y_{wD}\right)+$$

$$\left.\exp\left(-2\sqrt{sf(s)+n^2\pi^2 L_D^2+\frac{j^2\pi^2}{X_{eD}^2}}\,(Y_{eD}-Y_{wD})\right)\right]\cdot$$

$$\left[1+\sum_{m=1}^{\infty}\exp\left(-2m\sqrt{sf(s)+n^2\pi^2 L_D^2+\frac{j^2\pi^2}{X_{eD}^2}}\,Y_{eD}\right)\right]+$$

$$\left.\sum_{m=1}^{\infty}\exp\left(-2m\sqrt{sf(s)+n^2\pi^2 L_D^2+\frac{j^2\pi^2}{X_{eD}^2}}\,Y_{eD}\right)\right\}$$

(Equation 12)
$$\tilde{F}_{b3} = \frac{1}{s}\sum_{n=1}^{\infty}\frac{\cos(n\pi Z_{wD})\cos(n\pi Z_D)}{\sqrt{sf(s)+n^2\pi^2 L_D^2}}\cdot$$

$$\left\{K_{i1}\left[\sqrt{sf(s)+n^2\pi^2 L_D^2}\,(X_D+X_{wD}+1)\right]-\right.$$

$$K_{i1}\left[\sqrt{sf(s)+n^2\pi^2 L_D^2}\,(X_D+X_{wD}-1)\right]+$$

$$\sum_{m=1}^{\infty}\left[K_{i1}\left[\sqrt{sf(s)+n^2\pi^2 L_D^2}\,(2mX_{eD}-X_D+X_{wD}+1)\right]-\right.$$

$$K_{i1}\left[\sqrt{sf(s)+n^2\pi^2 L_D^2}\,(2mX_{eD}-X_D+X_{wD}-1)\right]+$$

$$K_{i1}\left[\sqrt{sf(s)+n^2\pi^2 L_D^2}\,(2mX_{eD}+X_D-X_{wD}+1)\right]-$$

$$K_{i1}\left[\sqrt{sf(s)+n^2\pi^2 L_D^2}\,(2mX_{eD}+X_D-X_{wD}-1)\right]+$$

$$K_{i1}\left[\sqrt{sf(s)+n^2\pi^2 L_D^2}\,(2mX_{eD}+X_D+X_{wD}+1)\right]-$$

$$K_{i1}\left[\sqrt{sf(s)+n^2\pi^2 L_D^2}\,(2mX_{eD}-X_D-X_{wD}+1)\right]-$$

$$K_{i1}\left[\sqrt{sf(s)+n^2\pi^2 L_D^2}\,(2mX_{eD}-X_D-X_{wD}-1)\right]+$$

$$\left.\left.K_{i1}\left[\sqrt{sf(s)+n^2\pi^2 L_D^2}\,(2mX_{eD}+X_D+X_{wD}-1)\right]\right]\right\}$$

After calculating the rate-transient functions (i.e., step 210), the computer application may calculate an imaging function for the well. (See step 220). The imaging function (i.e., $\epsilon$) may be created based on the mathematical model, the well's position in the reservoir and the shape of the reservoir. As such, the imaging function may be used to implement reservoir boundaries in the mathematical model.

In one implementation, the imaging function that may be applicable for an infinite conductivity horizontal well located in a closed rectangle drainage area may be derived using the reservoir pressure distribution solutions developed by Ozkan. (See Ozkan, E. 1988. *Performance of Horizontal Wells*, PhD dissertation, U. Of Tulsa.). As such, the composite imaging function for a horizontal well in a rectangle may be best evaluated using the readily computable expressions given in Equations 13-17 below, which represent images due to the boundaries that are in addition to the solution for a vertically fractured well in the same reservoir rectangular drainage area. The imaging function for a vertical fractured well in a rectangle ($\epsilon_f$) appears in Equation 13.

$$\epsilon = \epsilon_f + P_{Db} + P_{Db1} + P_{Db2} + P_{Db3} \quad \text{(Equation 13)}$$

where $$\epsilon_f = \frac{2\pi Y_{eD}}{X_{eD}}\left(\frac{1}{3} - \frac{Y_{wD}}{Y_{eD}} + \frac{Y_{wD}^2}{Y_{eD}^2}\right) + \frac{2X_{eD}}{\pi}\sum_{m=1}^{\infty}\frac{1}{m^2}\sin\left(\frac{m\pi}{X_{eD}}\right)\cos\left(\frac{m\pi X_{wD}}{X_{eD}}\right)$$

$$\cos\left(\frac{m\pi X_D}{X_{eD}}\right) \cdot \left[1 + \exp\left(-\frac{2m\pi Y_{eD}}{X_{eD}}\right) + \exp\left(-\frac{2m\pi Y_{wD}}{X_{eD}}\right) + \exp\left(-\frac{2m\pi(Y_{eD} - Y_{wD})}{X_{eD}}\right)\right] \cdot \left[1 + \sum_{n=1}^{\infty}\exp\left(-\frac{2mn\pi Y_{eD}}{X_{eD}}\right)\right]$$

$$P_{Db} = \frac{1}{\pi L_D}\sum_{n=1}^{\infty}\frac{\cos(n\pi Z_D)\cos(n\pi Z_{wD})}{n} \cdot \left[\int_0^{n\pi L_D(1+X_D-X_{wD})} K_0(u)\,du + \int_0^{n\pi L_D(1-X_D+X_{wD})} K_0(u)\,du\right] \quad \text{(Equation 14)}$$

$$P_{Db1} = \frac{2}{X_{eD}L_D}\sum_{n=1}^{\infty}\frac{\cos(n\pi Z_D)\cos(n\pi Z_{wD})}{n}\left\{\left[\exp(-2n\pi L_D Y_{eD}) + \exp(-2n\pi L_D Y_{wD}) + \exp(-2n\pi L(Y_{eD} - Y_{wD}))\right] \cdot \left[1 + \sum_{m=1}^{\infty}\exp(-2mn\pi L_D Y_{eD})\right] + \sum_{m=1}^{\infty}\exp(-2mn\pi L_D Y_{eD})\right\} \quad \text{(Equation 15)}$$

$$P_{Db2} = 4\sum_{m=1}^{\infty}\cos(m\pi Z_D)\cos(m\pi Z_{wD}) \quad \text{(Equation 16)}$$

$$\sum_{n=1}^{\infty}\frac{\sin\left(\frac{n\pi}{X_{eD}}\right)\cos\left(\frac{n\pi X_D}{X_{eD}}\right)\cos\left(\frac{n\pi X_{wD}}{X_{eD}}\right)}{n\sqrt{m^2\pi^2 L_D^2 + \frac{n^2\pi^2}{X_{eD}^2}}} \cdot$$

$$\left\{\left[\exp\left(-2\sqrt{m^2\pi^2 L_D^2 + \frac{n^2\pi^2}{X_{eD}^2}}\,Y_{eD}\right) + \exp\left(-2\sqrt{m^2\pi^2 L_D^2 + \frac{n^2\pi^2}{X_{eD}^2}}\,Y_{wD}\right) + \exp-2m2\pi 2LD2 + n2\pi 2XeD2YeD - YwD\cdot\right.\right.$$

$$\left.\left[1 + \sum_{j=1}^{\infty}\exp\left(-2j\sqrt{m^2\pi^2 L_D^2 + \frac{n^2\pi^2}{X_{eD}^2}}\,Y_{eD}\right)\right] + \sum_{j=1}^{\infty}\exp\left(-2j\sqrt{m^2\pi^2 L_D^2 + \frac{n^2\pi^2}{X_{eD}^2}}\,Y_{eD}\right)\right\}$$

The additional parameters that may be considered in the horizontal well case (Equations 13-17) include the dimensionless well length ($L_D$), the dimensionless well vertical spatial position in the reservoir (standoff from bottom) ($Z_{wD}$), and the dimensionless wellbore radius ($r_{wDz}$). These variables (as used in Equations 14-17) are defined in Equations 18, 19 and 20 for the dimensionless well length, standoff, and wellbore radius in anisotropic systems, respectively. Note that the system characteristic length for a horizontal well ($L_c$) is equal to half of the effective wellbore length in the reservoir ($L_h$).

$$L_D = \frac{L_c}{h}\sqrt{\frac{k_z}{k}} \quad \text{(Equation 18)}$$

$$Z_{wD} = \frac{z_w}{h} \quad \text{(Equation 19)}$$

$$r_{wDz} = \frac{r_w}{h}\sqrt{\frac{k_z}{k_y}} \quad \text{(Equation 20)}$$

As reported by Ozkan, the infinite conductivity horizontal well response may be evaluated using the uniform flux horizontal wellbore solutions using an equivalent wellbore spatial position along the axis of the wellbore that is a dimensionless distance of 0.732 from the midpoint of the wellbore length toward the heel or the toe of the horizontal wellbore. This concept also applies to the imaging functions given in Equations 13-17. This equivalent spatial position may be used in the analysis to obtain the equivalent infinite conductivity well response, provided that the dimensionless wellbore length satisfies the relationship given in Equation 21.

$$L_D \geq \frac{1.15}{1 - |X_D|} \quad \text{(Equation 21)}$$

This means that for dimensionless wellbore lengths ($L_D$) of about 4.291 or greater, the equivalent dimensionless distance ($X_D^*$) of 0.732 from the middle of the horizontal wellbore length in the reservoir can be used to evaluate the infinite conductivity wellbore response using the uniform flux solution. The infinite conductivity horizontal well response may therefore be evaluated at the spatial position $X_D = X_{wD} + X_D^*$, $Y_D = Y_{wD}$, and $Z_D = Z_{wD} + r_{wDz}$, where $X_D$, $Y_D$ and $Z_D$ are the dimensionless spatial position in the X, Y and Z directions, $X_{wD}$, $Y_{wD}$ and $Z_{wD}$ are the dimensionless X, Y and Z direction wellbore spatial positions, and $X_D^*$ is the dimensionless X direction spatial position distance from the midpoint of source/sink at which to evaluate the uniform flux solution to obtain the equivalent infinite conductivity response.

After calculating the imaging function (i.e., step 220), the computer application may calculate decline analysis functions using the imaging function and the rate-transient functions. (See step 230). Decline analysis functions may include: $t_{Dd}$ (dimensionless decline time function), $q_{Dd}$ (dimensionless decline flow rate), $Q_{PDd}$ (dimensionless decline cumulative production function) and $t_{PDd}$ (dimensionless decline pseudo-production time function).

In order to determine the decline analysis functions, the computer application may evaluate a fully-developed boundary-dominated flow wellbore rate-transient behavior of any type of well completion in a closed reservoir as defined by Equation 22 below. As mentioned above, the image function parameter ($\epsilon$) is a function of the reservoir drainage area shape, well location, and the specific type of well completion. As such, the dimensionless wellbore flow rate is defined for rate-transient solutions.

$$q_{wD}(t_D) = \frac{1}{\epsilon} \exp\left(-\frac{2\pi t_{DA}}{\epsilon}\right) \quad \text{(Equation 22)}$$

The definition of the dimensionless wellbore flow rate is given by Equation 23 for a liquid flow analysis such as that of an oil reservoir. The corresponding definition of the dimensionless wellbore flow rate that is applicable for gas reservoir analyses is given in Equation 24.

$$q_{wD} = \frac{141.2q\mu B}{kh(p_i - p_{wf})} \quad \text{(Equation 23)}$$

$$q_{wD} = \frac{50300 p_{sc} T q_g}{kh T_{sc}(p_p(p_i) - p_p(p_{wf}))} \quad \text{(Equation 24)}$$

The dimensionless time that is referenced to the system characteristic length ($t_D$) is defined in Equation 25 for an oil reservoir analysis and in Equation 26 for a gas reservoir analysis. The pseudotime function ($t_a(t)$) is defined for gas reservoir analyses as given in Equation 27.

$$t_D = \frac{0.000264 k t}{\phi \mu c_t L_c^2} \quad \text{(Equation 25)}$$

$$t_D = \frac{0.000264 k t_a(t)}{\phi L_c^2} \quad \text{(Equation 26)}$$

$$t_a(t) = \int_0^t \frac{dt}{\mu c_t} \approx \int_{p_i}^{p_r(t)} \frac{\frac{\partial t}{\partial p}}{\mu c_t} dp \quad \text{(Equation 27)}$$

The dimensionless time based on the drainage area ($t_{DA}$) is related to the dimensionless time ($t_D$) as provided in Equation 28.

$$t_{DA} = \frac{t_D}{A_D} \quad \text{(Equation 28)}$$

The dimensionless drainage area ($A_D$) is defined in Equation 29.

$$A_D = \frac{A}{L_c^2} \quad \text{(Equation 29)}$$

The dimensionless cumulative production for the rate-transient solution is defined in Equation 30 for an oil reservoir analysis and with Equation 31 for gas reservoir analyses.

$$Q_{pD} = \int_0^{t_D} q_{wD}(\tau) d\tau = \frac{N_p B}{1.119 \phi c_t h L_c^2 (p_i - p_{wf})} \quad \text{(Equation 30)}$$

$$Q_{pD} = \int_0^{t_D} q_{wD}(\tau) d\tau = \frac{318313 p_{sc} T G_p}{\phi h \overline{\mu_g c_t T}_{sc} L_c^2 (p_p(p_i) - p_p(p_{wf}))} \quad \text{(Equation 31)}$$

Under fully developed boundary-dominated flow conditions, the dimensionless cumulative production is given by Equation 32.

$$Q_{pD}(t_D) = \frac{A_D}{2\pi}\left[1 - \exp\left(\frac{-2\pi t_{DA}}{\epsilon}\right)\right] \quad \text{(Equation 32)}$$

From Equation 22, it can be observed that if an appropriate wellbore flow rate plotting function can be defined such that each of the dimensionless flow rate decline solutions is normalized by the product of the corresponding imaging function ($\epsilon$), a single boundary-dominated flow decline stem will be obtained. The definition of the appropriate flow rate decline function is therefore given by Equation 33.

$$q_{Dd} = \epsilon q_{wD} \quad \text{(Equation 33)}$$

The dimensionless decline time ($t_{Dd}$) is defined in a similar fashion. For instance, the exponential terms in Equations 22 and 32 are used to define a single late time decline stem as given in Equation 34.

$$t_{Dd} = \frac{2\pi t_D}{A_D \epsilon} \quad \text{(Equation 34)}$$

Substitution of the relationships given in Equations 33 and 34 in Equation 22, results in the general form of the normalized flow rate decline plotting function.

$$q_{Dd}(t_{Dd}) = \exp(-t_{Dd}) \quad \text{(Equation 35)}$$

The dimensionless decline cumulative production function ($Q_{pDd}$) is similarly defined as the integration of the dimensionless decline flow rate function ($q_{Dd}$) with respect to the dimensionless decline time ($t_{Dd}$).

$$Q_{pDd} = \int_o^{t_{Dd}} q_{Dd}(\tau) d\tau = \frac{2\pi Q_{pD}}{A_D} \quad \text{(Equation 36)}$$

For fully-developed boundary-dominated flow, the normalized dimensionless cumulative production function is given by Equation 37.

$$Q_{pDd}(t_{Dd}) = 1 - \exp(-t_{Dd}) = 1 - q_{Dd}(t_{Dd}) \quad \text{(Equation 37)}$$

After calculating the decline analysis functions (i.e., step 230), the computer application may plot dimensionless decline curves based on the decline analysis functions, thereby generating the dimensionless decline curves for the well. (See step 240). Traditional decline analysis functions have utilized dimensionless decline time normalized cumulative production and integral derivative plotting functions in addition to the conventional dimensionless decline flow rate plotting function to help characterize the production decline behavior of a well. These plotting functions are defined in Equations 38 and 39 for the decline analysis flow rate integral and integral-derivative functions respectively.

$$q_{Ddi}(t_{Dd}) = \frac{1}{t_{Dd}} \int_0^{t_{Dd}} q_{Dd}(\tau) d\tau = \frac{Q_{pDd}(t_{Dd})}{t_{Dd}} \quad \text{(Equation 38)}$$

$$q_{Ddid}(t_{Dd}) = -\frac{dq_{Ddi}(t_{Dd})}{d \ln(t_{Dd})} = q_{Ddi}(t_{Dd}) - q_{Dd}(t_{Dd}) \quad \text{(Equation 39)}$$

The dimensional production decline analysis functions that are consistent with the dimensionless reference production decline analyses include the pressure drop normalized flow rate ($q/\Delta p$) and cumulative production ($N_p/\Delta p$) functions for oil reservoir analyses. For gas reservoir analysis, the pressure drop term in each of these variables is replaced by the corresponding pseudopressure drop ($\Delta p_p$) value that corresponds to the pressure drop. Therefore, the dimensional graphical analysis plotting functions that may be used in an oil reservoir analysis are the pressure drop normalized flow rate [$q/(p_i-p_{wf})$] and pseudo-producing time ($N_p/q$) plotted versus the pressure drop normalized cumulative production [$N_p/(p_i-p_{wf})$].

For gas reservoir analysis, the dimensional graphical analysis plotting functions that may be used are the pseudopressure drop normalized flow rate [$q_g/(p_p(p_i)-p_p(p_{wf}))$] and the pseudo-producing time ($G_p/q_g$) plotted against the pseudopressure drop normalized cumulative production [$G_p/(p_p(p_i)-p_p(p_{wf}))$]. The evaluation of the pseudopressure values that correspond to the initial reservoir pressure and the sandface flowing pressures are computed in a conventional manner that is typically done in pressure-transient gas well test analyses.

It has been well established in the petroleum literature that in order to obtain a reasonably unique match of actual well production performance data in a decline curve analysis, the field data record being matched must contain both transient (infinite-acting reservoir behavior) and boundary-dominated flow well performance data. Transient well performance data can be matched to a large number of transient decline stems in a traditional decline curve analysis since the family of decline flow rate curves are essentially symmetric (or parallel) with each other. The corresponding transient derivative function curves are also generally symmetric with each other. This results in a non-unique match for the transient production performance data only.

Similarly, production data records that consist entirely of boundary-dominated flow behavior in a traditional decline curve analysis will not provide information related to the early transient behavior of the well. Very rarely will boundary-dominated flow production data alone provide estimates of the well completion and reservoir properties that are typically present in the early transient behavior of the well.

However, an alternative plotting function may be constructed from the ratio of the dimensionless decline cumulative production and decline flow rate functions as shown in Equation 40.

$$\frac{Q_{pDd}}{q_{Dd}} = \frac{2\pi Q_{pD}}{A_D \varepsilon q_{wD}} \quad \text{(Equation 40)}$$

The alternative plotting function described in Equation 40 may be used to generate the dimensionless decline curves. An example of the dimensionless decline curves for an infinite conductivity horizontal well for dimensionless wellbore length 50 ($L_D$) is provided in FIG. 3.

Figure 3:
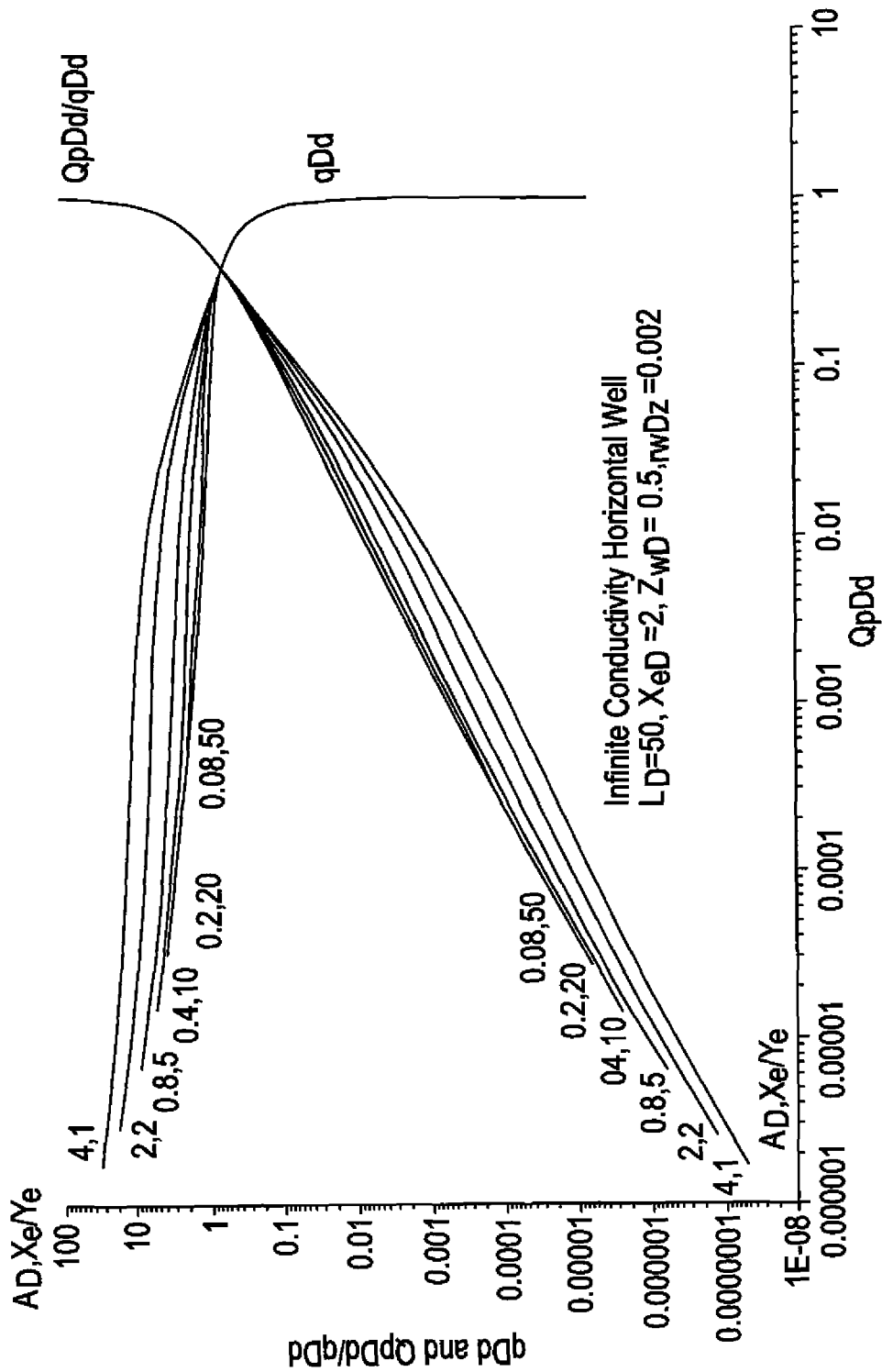
FIG. 3 illustrates a graph of dimensionless decline curves in accordance with implementations of various techniques described herein.
Figure 4:
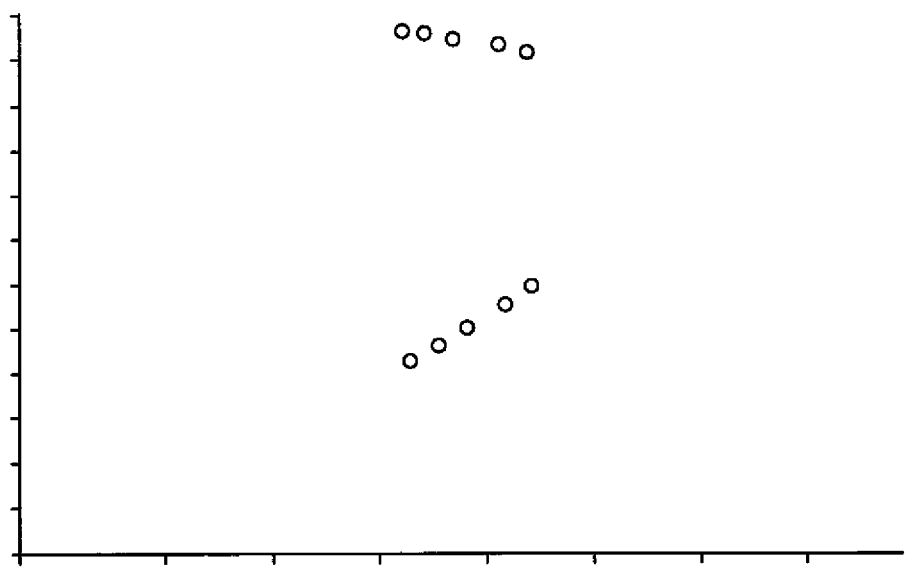
FIG. 4 illustrates a graph of overlay curves in accordance with implementations of various techniques described herein.

As seen in FIG. 3, it is obvious that the pair of production decline graphical analysis functions exhibit converging trends throughout the transient flow regime on the same X and Y scales, even through to the onset of fully developed boundary-dominated flow. The dimensional production data can therefore in practice reasonably only match best on the converging pair of reference decline analysis functions over a very narrow window of possibilities. In every case, the plotting function parameters are known with certainty according to the flow rate and cumulative production as a function of time. As such, a general production decline analysis matching procedure may be readily applied to entirely transient (infinite-acting) well production data. The general production decline analysis matching procedure may then be used to obtain relatively accurate estimates of the formation and well completion properties, the reservoir effective drainage area, initial-fluids-in-place, and the production time until the onset of boundary-dominated flow.

There are many advantages in using this alternative plotting function over the traditional decline rate, integral, and derivative functions typically used in decline analysis. First, there is no need to compute a derivative of a commonly very noisy production data record. Typically, apparent outliers in the data are omitted or the data record is smoothed such that reasonable flow rate integral and derivative function values (Equations 38 and 39) obtained in a traditional decline curve analysis are often more art than scientific. The alternative plotting function eliminates this omission of apparent outliers and the smoothing effects on the data. Second, by using the relative time function as a plotting variable ($Q_{pDd}/q_{Dd}$) in combination with the conventional dimensionless decline flow rate function ($q_{Dd}$) (both function of the dimensionless decline cumulative production), the pair of functions exhibit converging trends throughout the transient flow regime all the way through to the boundary-dominated flow regime. As such, a unique match of the well performance data on the reference decline curve set can be identified using only the transient flow regime because there tends to be only a single position on the match surface that provides the best agreement between the reference decline curve set and the dimensional production data.

The definition of the dimensionless pseudo-producing time function is given in Equation 41 for oil reservoir analyses. The corresponding expression that is applicable for gas reservoir analyses is given by Equation 42.

$$t_{Dmb}(t) = \frac{0.000264 k t_{mb}(t)}{\phi \mu c_t L_c^2} = \frac{0.00633 k N_p(t)}{\phi \mu c_t L_c^2 q(t)} \quad \text{(Equation 41)}$$

$$t_{Dmb}(t) = \frac{0.000264 k t_a(t_{mb}(t))}{\phi L_c^2} = \frac{6.33 k t_a(G_p(t)/q_g(t))}{\phi L_c^2} \quad \text{(Equation 42)}$$

The relationship between that function and the newly-introduced decline curve analysis relative time function of this work is given by Equation 43. Note that the coefficient relating the relative decline time in Equation 43 is identical to that of the coefficient in the relationship between the dimensionless decline time and conventional superposition dimensionless time in Equation 34.

$$\frac{Q_{pDd}}{q_{Dd}} = \frac{2\pi t_{Dmb}}{A_D \varepsilon} \quad \text{(Equation 43)}$$

Referring back to FIG. 1, after generating the dimensionless decline curves for the well, at step 130, the computer application may receive production or reservoir data from the well being analyzed. Production and reservoir data may include production logs, well logs, wireline logs and the like. Production data may generally include the fluid phase production data (oil, gas, and water flow rates or cumulative production) of the well as well as the wellhead and/or bottomhole wellbore flowing pressures as a function of production time.

At step 140, the computer application may prepare the production data into a format that matches the dimensionless decline curves. In one implementation, the computer application may transform the production data into an overlay curve on an overlay grid. The overlay curve may correspond to the dimensionless decline curves such that it may be mapped onto the dimensionless decline curves generated at step 120. In one implementation, the overlay curve for oil production data is formatted according to Equations 30 and 36 as defined above. Similarly, the overlay curve for gas production data is formatted according to Equations 31 and 36 as defined above. An example of an overlay curve is provided in FIG. 4.

At step 150, the computer application may identify a match point between the overlay curve and the dimensionless decline curves. In order to identify the match point, the computer application may fit the overlay curve onto the dimensionless decline curves such that points on the overlay curve match or fit onto one of the dimensionless decline curve.

The identification of the match point may be resolved in a conventional manner, analogous to other type curve matching procedures that are commonly used in the industry. The dimensionless decline curves, overlay curve match points and identified match stem values may then be used to determine the reservoir and well completion properties.

Figure 5A:
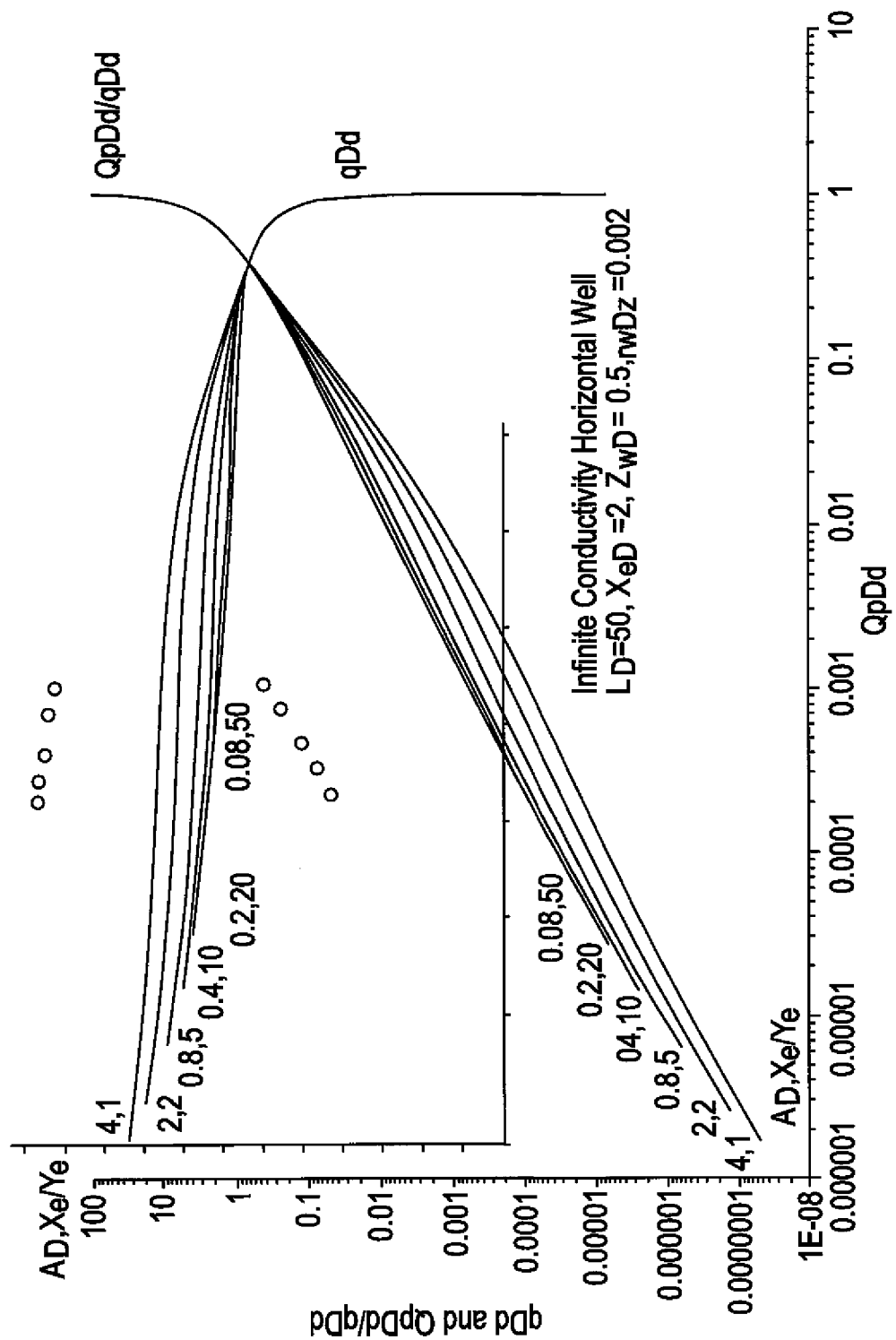
FIG. 5A illustrates a graph of overlay curves on a graph of dimensionless decline curves in accordance with implementations of various techniques described herein.
Figure 5B:
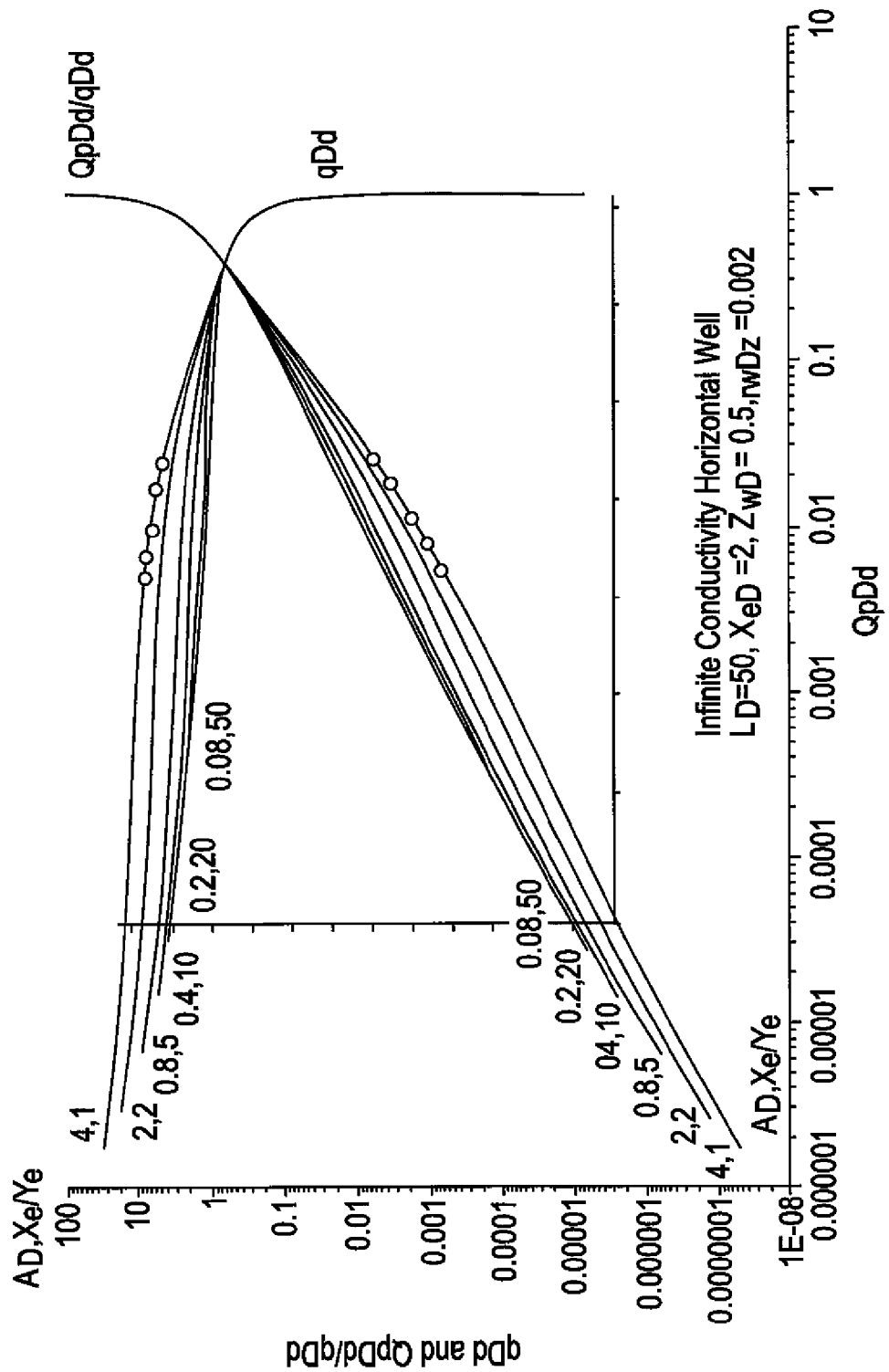
FIG. 5B illustrates a graph of overlay curves matched to a dimensionless decline curve on a graph of dimensionless decline curves in accordance with implementations of various techniques described herein.

In one implementation, the computer application may place the overlay curve on a grid containing the dimensionless decline curves, as shown in FIG. 5A. The computer application may then move the overlay curve across the grid until points on the overlay curve fit onto one of the dimensionless decline curves as shown in FIG. 5B. In one implementation, any one of the points on the overlay curve that fits on the dimensionless decline curves may be the match point. However, it should be noted that in other implementations, after the overlay curve has been fit onto one of the dimensionless decline curves, any point on the overlay grid (i.e., the grid having the overlay curve) may also be used as the match point.

By using dimensionless decline curves that have been developed from rate-transient boundary-dominated flow theory, method 100 results in improved matches of the field production performance data with the reference decline curves and provides a practical production performance interpretation technique for the evaluation of well and completion properties in slow-stabilizing wells using only the early time transient (infinite-acting reservoir) production behavior.

The use of the decline flow rate ($q_{Dd}$) and flow rate normalized cumulative production ($Q_{pDd}/q_{Dd}$) functions in the graphical decline curve analysis (1) eliminates the computation of derivatives or integral-derivatives, (2) eliminates the questionable omission of suspected outliers in the analysis of the production data record, (3) provides a unique graphical production decline analysis match due to converging function trends on the same graph rather than symmetric or parallel functions, and (4) permits the evaluation of the drainage area, initial-fluids-in-place, and time to the onset of boundary effects even when only the early transient behavior of the well is exhibited in the production data record. This is possible even though the reflection of the boundary effects is not evident in the wellbore pressure or rate-transient behavior. However, the rate of change in the cumulative well production with respect to the production decline flow rate ($Q_{pDd}/q_{Dd}$) does reflect the effects of the reservoir dimensions and well location within the drainage area in the cumulative production of the well.

At step 160, the computer application may calculate the reservoir effective drainage area using the values that correspond to the overlay curve and the dimensionless decline curves for the match point. The corresponding values may be indicated on the X and Y axes of the overlay curve's grid and the dimensionless decline production curves' grid at the match point. Using these corresponding values, the reservoir effective drainage area for oil reservoir production data may be calculated based on Equations 30 and 36 provided above and Equation 44 provided below.

$$A = \frac{5.6146 B}{\phi c_t h} \frac{\left[\frac{N_p}{p_i - p_{wf}}\right]_m}{[Q_{pDd}]_m} \quad \text{(Equation 44)}$$

The dimensions of the reservoir drainage area can be readily determined using the matched aspect ratio and drainage area value that has been obtained as shown in Equation 45.

$$A = X_e Y_e = \left[\frac{X_e}{Y_e}\right] Y_e^2 \quad \text{(Equation 45)}$$

The drainage area extents in the Y and X directions may then be determined as follows.

$$Y_e = \sqrt{\frac{A}{\left[\frac{X_e}{Y_e}\right]}} \quad \text{(Equation 46)}$$

$$X_e = \left[\frac{X_e}{Y_e}\right] Y_e \quad \text{(Equation 47)}$$

Based on the dimensionless drainage area A and a $X_e/Y_e$ drainage area aspect ratio, the imaging function $\varepsilon$ may be determined and used to determine the geometric mean effective horizontal permeability. Determining the geometric mean effective horizontal permeability may be accomplished using the match point coordinates of the decline flow rate function and the definitions of the variables for a slightly compressible liquid given in Equations 23 and 33. The resulting expression for determining the geometric mean effective permeability of an oil reservoir is given in Equation 48.

$$k = \frac{141.205\mu B\varepsilon}{h} \frac{\left[\frac{q}{p_i - p_{wf}}\right]_m}{q_{Ddm}}$$ (Equation 48)

The directional horizontal effective permeabilities can then be estimated using the relationships that follow.

$$k_x = \frac{k}{\sqrt{\frac{k_y}{k_x}}}$$ (Equation 49)

$$k_y = \left[\frac{k_y}{k_x}\right] k_x$$ (Equation 50)

The wellbore effective length can be determined using the previously determined directional effective permeabilities and the $L_D$ match decline stem. The effective wellbore length (which is twice the system characteristic length) is therefore determined by rearranging Equation 18.

$$L_h = 2L_c = \frac{2hL_D}{\sqrt{\frac{k_z}{k}}}$$ (Equation 51)

The reservoir effective drainage area for gas reservoir production data may be calculated based on Equations 31 and 36 provided above and Equation 52 provided below.

$$A = \frac{2 \times 10^6 p_{sc} T}{\phi \overline{\mu}_g c_i h T_{sc}} \frac{\left[\frac{G_p}{p_p(p_i) - p_p(p_{wf})}\right]_m}{[Q_{pDd}]_m}$$ (Equation 52)

The drainage area extents in the Y and X directions may then be determined using Equations 46-47 above. Based on the dimensionless drainage area A and a $X_e/Y_e$ drainage area aspect ratio, the imaging function ε may be determined and used to determine the reservoir effective permeability of a gas reservoir. The reservoir effective permeability of the gas reservoir may then be determined from the match point and definition of the dimensionless decline flow rate. The relationship for determining the reservoir effective permeability is given in Equation 53.

$$k = \frac{50300 p_{sc} T\varepsilon}{hT_{sc}} \frac{\left[\frac{q_g}{p_p(p_i) - p_p(p_{wf})}\right]_m}{[q_{Dd}]_m}$$ (Equation 53)

After determining the reservoir effective drainage area, the computer application may determine various reservoir and well completion data as well as well completion effectiveness parameters in a systematic manner based on the reservoir effective drainage area and the decline curve analysis match curve parameters (i.e., obtained from the match point). The decline curve analysis match curve parameters may include dimensionless drainage area ($A_D$) or dimensionless reservoir drainage radius ($r_{eD}$), dimensionless fracture conductivity ($C_{fD}$), dimensionless well bore length ($L_D$), drainage extent in a specified direction ($X_e/Y_e$) and the like.

In one implementation, the interpretation of the match results of the production decline analyses may be resolved in a conventional manner, analogous to other type curve matching procedures that are commonly used in the industry. The dimensionless reference, dimensional production data curve match points, identified match stem or corresponding values may then be used to determine the reservoir and well completion properties.

In the case of an infinite conductivity horizontal well that is located in a low-permeability closed rectangle reservoir drainage area, at least three (and potentially up to six) parameters are required to fully characterize the production decline stems in the reference decline set. In addition to the drainage area and aspect ratio that are applicable for a vertical fracture, the horizontal well solution also includes the effect of the dimensionless wellbore length ($L_D$), and possibly the effects of dimensionless well standoff from the bottom of the reservoir ($Z_{wD}$) and the wellbore radius ($r_{wDe}$). As a base case, the dimensionless well standoff may be assumed to be equal to 0.5 (wellbore centered in the reservoir height) and a median dimensionless wellbore radius of 0.002 may be selected. In higher permeability formations, the X direction drainage area extent should also be considered as a variable.

For low-permeability reservoirs, and for early transient behavior of vertically fractured or horizontal wells in low-permeability reservoirs, the number of possible reference decline curve sets and parameters that are required may be reduced. For example, the early transient behavior of a vertically fractured well in a low-permeability reservoir can be adequately characterized with the assumption of a drainage area extent in the X direction approximately equal to the effective length of the fracture ($X_{eD}$=2). The transient decline stems that are required can then be reasonably well characterized with only two parameters; the $X_e/Y_e$ aspect ratio of the reservoir drainage area and the dimensionless fracture conductivity. The effective drainage area is assumed to be that of a closed rectangle in each case.

In a similar manner, the early transient behavior of an infinite conductivity horizontal well in a low-permeability reservoir aids in reducing the number of parameters that must be included in the reference decline curve set. Analogous to the issue of reservoir drainage beyond the ends of a vertical fracture in a low-permeability reservoir at early transient times, the horizontal wellbore will at early transient times only effectively drain the reservoir up to about the length of the completed horizontal well length in the reservoir. The dimensionless wellbore standoff ($Z_{wD}$) and the wellbore radius ($r_{wDe}$) do have an influence on the rate-transient behavior of the well, even at very early transient times but are often assumed to be represented by average values, such as a dimensionless standoff of the wellbore at mid-zone ($Z_{wD}$=0.5) and a median wellbore radius value of about 0.002.

The reference decline curve sets for an infinite conductivity horizontal wellbore in a low-permeability closed rectangle reservoir may therefore best be constructed with two different sets of parameters. One set of reference production decline curves can be constructed with an assumed X direction drainage area extent equal to the wellbore length ($X_{eD}$=2), a mid-zone standoff ($Z_{wD}$=0.5), and a median dimensionless wellbore radius of 0.002. These decline curve sets have transient stems with the $X_e/Y_e$ drainage area aspect ratio and dimensionless wellbore length ($L_D$) as parameters.

A second set of reference horizontal well production decline curves may also be constructed such that some known portion of the drilled wellbore length in the reservoir may be attributed to the formation, thus eliminating one unknown parameter from the analysis ($L_D$). The decline curve sets are therefore constructed for a range of known $L_D$ values, but with transient stem values that have the $X_e/Y_e$ aspect ratio and the dimensionless wellbore standoff or wellbore radius as parameters.

In addition to the infinite conductivity horizontal wellbore parameters, other well type parameters may also be determined. For example, in an unfractured vertical well that is centrally located in a closed circular reservoir, a single decline curve stem parameter ($r_{eD}$) may be required to fully consider all of the necessary parameters of the problem. In this case, the use of the apparent wellbore radius ($r_{wa}$), such that the characteristic length of the system ($L_c$) can be modified to include the effect of near well flow impairment or improvement. The dimensionless drainage radius ($r_{eD}$) may therefore be referenced to the apparent wellbore radius ($r_{eD}=r_e/r_{wa}$), as well as to the dimensionless cumulative production.

Further, with a finite-conductivity vertical fracture that is located in a low-permeability closed rectangle drainage area, at least two parameters may be required to fully characterize each of the production decline stems in the reference decline set. These parameters may include the rectangle drainage area aspect ratio and the dimensionless fracture conductivity. If the reservoir permeability is somewhat higher (more moderate), then an additional parameter should also be considered to account for the increase in the X direction drainage area extent to account for the contribution to the well production from the reservoir region beyond the effective length of the fracture. Modifications of the dimensionless spatial parameters can also be made to include the effects of reservoir permeability anisotropy or for a dual porosity reservoir.

Although methods 100 and 200 have been described with reference to an infinite conductivity horizontal well, as mentioned above, it should be understood that methods 100 and 200 may be performed on any type of well. In order to perform methods 100 and 200 on different types of wells, some of the equations described with respect to methods 100 and 200 may be replaced with equations that correspond to the particular type of well. Some of the alternate equations that may be used for various steps in methods 100 and 200 for different types of wells are provided below.

Mathematical Model (Step 110)
Vertical Well

The dual porosity reservoir form of wellbore pressure-transient solution is given by Equation 54.

The corresponding rate-transient wellbore solution is obtained, such that:

$$\tilde{q}_{wD}(s) = \frac{1}{s^2 \tilde{p}_{wD}(s)} \quad \text{(Equation 55)}$$

Finite-Conductivity Vertical Fracture

The effective reservoir drainage area resulting from the production of a vertically fractured well in a low permeability reservoir has been demonstrated to be more elongated along the fracture axis, rather than draining more of the reservoir normal to the fracture plane. This results in the reservoir drainage area being more elliptical or rectangular in shape, instead of a square drainage area. In fact, the drainage area length associated with a vertically fractured well in a low permeability reservoir is essentially equal to the effective and productive, "cleaned-up" length of the fracture.

This leads to the selection of the reservoir drainage area configurations used in the construction of the composite production decline curve set developed for vertically fractured wells in low permeability reservoirs. The ideal reservoir drainage area for a vertically fractured well in a low permeability reservoir may therefore be that of a square, with dimensions of $X_e$ by $Y_e$ in which $X_e=Y_e$. This results in a dimensionless drainage area of 4 and a $X_e/Y_e$ aspect ratio of 1. A range of other aspect ratios have also been considered, with the largest $X_e/Y_e$ aspect ratio evaluated in the study and included in the reference decline curve solutions being a value of 100.

The wellbore dimensionless pressure-transient solution for a finite-conductivity vertical fracture may be evaluated using the bounded reservoir solutions constructed with the finite reservoir pressure distribution solutions. The rate-transient well response for a finite-conductivity vertical fracture is computed from the pressure-transient wellbore solution using Equation 55.

Imaging Function (Step 220)
Unfractured Vertical Well

The imaging function for a fully-completed unfractured vertical well that is centrally located in a closed circular reservoir is given by Equation 56.

$$\varepsilon = \ln(r_{eD}) - \frac{3}{4} \quad \text{(Equation 56)}$$

The system characteristic length ($L_c$) in this case is chosen to be the apparent wellbore radius ($r_{wa}$). The apparent wellbore radius is related to the wellbore radius and near well steady state skin effect as defined in Equation 57.

$$r_{wa} = r_w \exp(-S) \quad \text{(Equation 57)}$$

The dimensionless effective drainage radius ($r_{eD}$) for an unfractured vertical well in a circular drainage area is therefore defined in Equation 58.

$$r_{eD} = \frac{r_e}{L_C} = \frac{r_e}{r_{wa}} \quad \text{(Equation 58)}$$

$$\tilde{p}_{wD}(s) = \frac{K_0(\sqrt{sf(s)})I_1(\sqrt{sf(s)}\,r_{eD}) + I_0(\sqrt{sf(s)})K_1(\sqrt{sf(s)}\,r_{eD})}{s\sqrt{sf(s)}\,[K_1(\sqrt{sf(s)})I_1(\sqrt{sf(s)}\,r_{eD}) - I_1(\sqrt{sf(s)})K_1(\sqrt{sf(s)}\,r_{eD})]} \quad \text{(Equation 54)}$$

Finite Conductivity Vertical Fracture

In systems with elongated sources/sinks in the reservoir, such as those with vertically fractured wells or horizontal wellbores, a more representative configuration of the reservoir effective drainage area in low permeability reservoirs is a rectangle with a length roughly equal to or slightly larger than the total length of the source in the system ($2L_c$), and with a width commonly much less than the length. The system characteristic length ($L_c$) of a vertically fractured well is the effective half-length of the fracture ($X_f$).

For a vertical fracture in a closed rectangle, the imaging function ($\epsilon$) that is required to properly scale the decline curve family to obtain a single boundary-dominated flow decline stem that corresponds to the exponential decline solution is given in a readily computable form by Equation 59.

$$\varepsilon = \frac{2\pi Y_{eD}}{X_{eD}}\left(\frac{1}{3} - \frac{Y_{wD}}{Y_{eD}} + \frac{Y_{wD}^2}{Y_{eD}^2}\right) + \quad \text{(Equation 59)}$$

$$\frac{2X_{eD}}{\pi}\sum_{m=1}^{\infty}\frac{1}{m^2}\sin\left(\frac{m\pi}{X_{eD}}\right)\cos\left(\frac{m\pi X_{wD}}{X_{eD}}\right)$$

$$\cos\left(\frac{m\pi X_D}{X_{eD}}\right)\cdot\left[1+\exp\left(-\frac{2m\pi Y_{eD}}{X_{eD}}\right)+\right.$$

$$\left.\exp\left(-\frac{2m\pi Y_{wD}}{X_{eD}}\right)+\exp\left(-\frac{2m\pi(Y_{eD}-Y_{wD})}{X_{eD}}\right)\right]\cdot$$

$$\left[1+\sum_{n=1}^{\infty}\exp\left(-\frac{2mn\pi Y_{eD}}{X_{eD}}\right)\right]$$

For finite-conductivity vertical fractures, the dimensionless distance along the fracture from the wellbore at which to evaluate the imaging solution presented in Equation 55 to obtain the equivalent finite-conductivity fractured well solution response may be evaluated using the expression given in Equation 60 for fracture dimensionless conductivities greater than or equal to 4.1635.

$$X_D^* = 0.7355 - 1.5609\left(\frac{1}{c_{fD}}\right) + 1.5313\left(\frac{1}{c_{fD}}\right)^2 - \quad \text{(Equation 60)}$$

$$179.4346\left(\frac{1}{c_{fD}}\right)^3 + 3928.97\left(\frac{1}{c_{fD}}\right)^4 - 40211.24\left(\frac{1}{c_{fD}}\right)^5 +$$

$$183267.48\left(\frac{1}{c_{fD}}\right)^6 - 305367.26\left(\frac{1}{c_{fD}}\right)^7$$

The dimensionless fracture conductivity is defined as presented in Equation 61. Note that the spatial position at which to evaluate the imaging solution for a finite-conductivity vertical fracture is therefore given by $X_D = X_{wD} + X_D^*$ and $Y_D = Y_{wD}$.

$$C_{fD} = \frac{k_f b_f}{k X_f} \quad \text{(Equation 61)}$$

However, note that in practice the dimensionless fracture conductivity has a negligible effect on the image function values that are obtained with Equation 61 for vertically fractured wells. Example computations with Equation 61 for a range of dimensionless fracture conductivities (with $X_{eD}=2$) result in the same values for the imaging function. The parameters that measurably influence the imaging function of Equation 61 are the well location and the dimensions of the reservoir drainage area.

Figure 6:
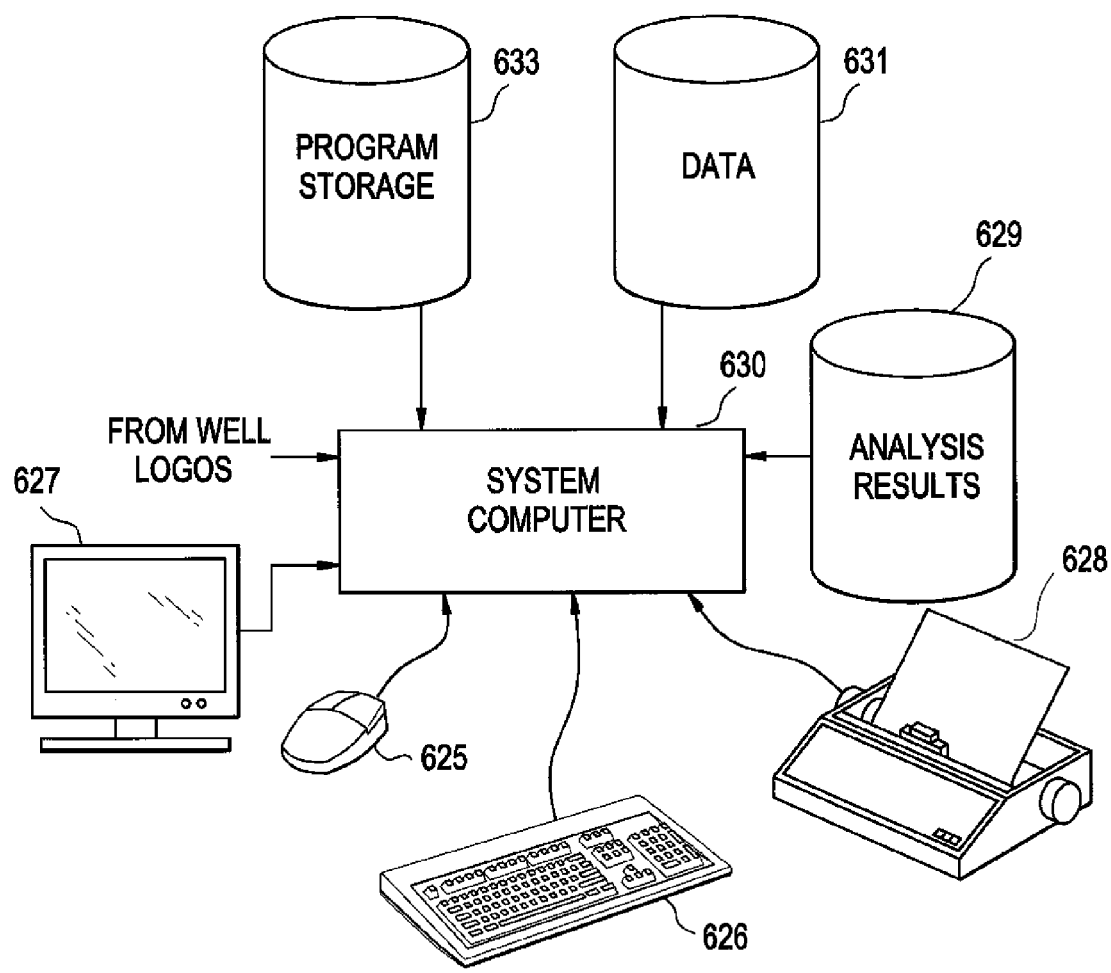
FIG. 6 illustrates a computer network into which implementations of various technologies described herein may be implemented.

FIG. 6 illustrates a computer network into which implementations of various technologies described herein may be implemented. The computing system 600 (system computer) may include one or more system computers 630, which may be implemented as any conventional personal computer or server. However, those skilled in the art will appreciate that implementations of various techniques described herein may be practiced in other computer system configurations, including hypertext transfer protocol (HTTP) servers, hand-held devices, multiprocessor systems, microprocessor-based or programmable consumer electronics, network PCs, minicomputers, mainframe computers, and the like.

The system computer 630 may be in communication with disk storage devices 629, 631, and 633, which may be external hard disk storage devices. It is contemplated that disk storage devices 629, 631, and 633 are conventional hard disk drives, and as such, will be implemented by way of a local area network or by remote access. Of course, while disk storage devices 629, 631, and 633 are illustrated as separate devices, a single disk storage device may be used to store any and all of the program instructions, measurement data, and results as desired.

In one implementation, well information may be stored in disk storage device 631. The system computer 630 may retrieve the appropriate data from the disk storage device 631 to characterize flow production of a well according to program instructions that correspond to implementations of various techniques described herein. The program instructions may be written in a computer programming language, such as C++, Java and the like. The program instructions may be stored in a computer-readable medium, such as program disk storage device 633. Such computer-readable media may include computer storage media and communication media. Computer storage media may include volatile and non-volatile, and removable and non-removable media implemented in any method or technology for storage of information, such as computer-readable instructions, data structures, program modules or other data. Computer storage media may further include RAM, ROM, erasable programmable read-only memory (EPROM), electrically erasable programmable read-only memory (EEPROM), flash memory or other solid state memory technology, CD-ROM, digital versatile disks (DVD), or other optical storage, magnetic cassettes, magnetic tape, magnetic disk storage or other magnetic storage devices, or any other medium which can be used to store the desired information and which can be accessed by the system computer 630. Communication media may embody computer readable instructions, data structures or other program modules. By way of example, and not limitation, communication media may include wired media such as a wired network or direct-wired connection, and wireless media such as acoustic, RF, infrared and other wireless media. Combinations of any of the above may also be included within the scope of computer readable media.

In one implementation, the system computer 630 may present output primarily onto graphics display 627, or alternatively via printer 628. The system computer 630 may store the results of the methods described above on disk storage 629, for later use and further analysis. The keyboard 626 and the pointing device (e.g., a mouse, trackball, or the like) 625 may be provided with the system computer 630 to enable interactive operation.

The system computer 630 may be located at a data center remote from the region were the earth formations were obtained from. The system computer 630 may be in communication with a logging device (either directly or via a recording unit), to receive signals indicating the measurements on the earth formations. These signals, after conventional formatting and other initial processing, may be stored by the system computer 630 as digital data in the disk storage 631 for subsequent retrieval and processing in the manner described above. In one implementation, these signals and data may be sent to the system computer 630 directly from sensors, such as well logs and the like. When receiving data directly from the sensors, the system computer 630 may be described as part of an in-field data processing system. In another implementation, the system computer 630 may process seismic data already stored in the disk storage 631. When processing data stored in the disk storage 631, the system computer 630 may be described as part of a remote data processing center, separate from data acquisition. The system computer 630 may be configured to process data as part of the in-field data processing system, the remote data processing system or a combination thereof. While FIG. 6 illustrates the disk storage 631 as directly connected to the system computer 630, it is also contemplated that the disk storage device 631 may be accessible through a local area network or by remote access. Furthermore, while disk storage devices 629, 631 are illustrated as separate devices for storing input seismic data and analysis results, the disk storage devices 629, 631 may be implemented within a single disk drive (either together with or separately from program disk storage device 633), or in any other conventional manner as will be fully understood by one of skill in the art having reference to this specification.

While the foregoing is directed to implementations of various technologies described herein, other and further implementations may be devised without departing from the basic scope thereof, which may be determined by the claims that follow. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for characterizing flow production of a well, comprising:
    generating onto a graphics display, using a computer, a plurality of dimensionless decline curves from a mathematical model that characterizes an expected flow production of the well, wherein:
        the plurality of dimensionless decline curves are generated using a plurality of decline analysis functions determined based on a plurality of rate transient functions and an imaging function that correspond to the mathematical model; and
        the plurality of decline analysis functions comprise a dimensionless decline cumulative production function and a dimensionless decline flow rate function;
    generating onto the graphics display a flow rate normalized cumulative production curve for the expected flow production of the well, wherein the flow rate normalized cumulative production curve is a function of the ratio of the dimensionless decline cumulative production function to the dimensionless decline flow rate function;
    generating an overlay curve based on production data pertaining to the well;
    fitting the overlay curve onto the graphics display to generate a fitted overlay curve, wherein the fitted overlay curve is based on a match between one of the plurality of dimensionless decline curves and the flow rate normalized cumulative production curve; and
    calculating a reservoir effective drainage area for the well using values that correspond to the fitted overlay curve, the flow rate normalized cumulative production curve, and the one of the plurality of dimensionless decline curves.

2. The method of claim 1, wherein the mathematical model is based on information pertaining to the well.

3. The method of claim 2, wherein the information describes the well as an unfractured vertical well, a finite-conductivity vertical fracture well, an infinite conductivity horizontal well, or combinations thereof.

4. The method of claim 1, wherein generating the plurality of dimensionless decline curves, comprises:
    determining the plurality of rate transient functions that correspond to the mathematical model;
    determining the imaging function that corresponds to the mathematical model;
    determining the plurality of decline analysis functions based on the plurality of rate transient functions and the imaging function; and
    plotting the dimensionless decline curves based on the plurality of decline analysis functions.

5. The method of claim 4, wherein the plurality of rate transient functions comprises a dimensionless time, a dimensionless wellbore flow rate solution and a dimensionless rate-transient well cumulative production.

6. The method of claim 4, wherein the imaging function is determined based on a position of the well in a reservoir, a shape of the reservoir or combinations thereof.

7. The method of claim 4, wherein the imaging function provides one or more reservoir boundaries for the mathematical model.

8. The method of claim 4, wherein the plurality of decline analysis functions comprises a dimensionless decline time function and a dimensionless decline pseudo-production time function.

9. The method of claim 1, wherein the production data comprises reservoir data.

10. The method of claim 1, wherein the production data comprises fluid phase production data of the well, a plurality of wellhead flowing pressures as a function of production time, a plurality of bottomhole wellbore flowing pressures as a function of production time, or combinations thereof.

11. The method of claim 1, wherein the overlay curve is in the same format as the plurality of dimensionless decline curves.

12. The method of claim 1, wherein fitting the overlay curve comprises:
    identifying a match point between the overlay curve and the one of the plurality of dimensionless decline curves; and
    determining one or more values from the one of the plurality of dimensionless decline curves and the overlay curve that correspond to the match point.

13. The method of claim 12, wherein the values from the one of the plurality of dimensionless decline curves comprise a plurality of decline curve analysis match curve parameters.

14. The method of claim 13, wherein the plurality of decline curve analysis match curve parameters comprises a dimensionless drainage area, a dimensionless reservoir drainage radius, a dimensionless fracture conductivity, a dimensionless wellbore length, one or more drainage extents in one or more drainage directions, or combinations thereof.

15. The method of claim 1, wherein fitting the overlay curve comprises:

identifying a match point between the overlay curve and the one of the plurality of dimensionless decline curves from a grid of the plurality of dimensionless decline curves; and determining one or more values from the one of the plurality of dimensionless decline curves and the overlay curve that correspond to the match point.

16. The method of claim 1, further comprising calculating reservoir and well completion data and well completion effectiveness parameters based on the reservoir effective drainage area.

17. A system, comprising:
a processor; and
a memory comprising program instructions executable by the processor to:
generate onto a graphics display a plurality of dimensionless decline curves from a mathematical model that characterizes an expected flow production of the well, wherein:
the plurality of dimensionless decline curves are generated using a plurality of decline analysis functions determined based on a plurality of rate transient functions and an imaging function that correspond to the mathematical model; and
the plurality of decline analysis functions comprise a dimensionless decline cumulative production function and a dimensionless decline flow rate function;
generate onto the graphics display a flow rate normalized cumulative production curve for the expected flow production of the well, wherein the flow rate normalized cumulative production curve is a function of the ratio of the dimensionless decline cumulative production function to the dimensionless decline flow rate function;
generate an overlay curve based on production data pertaining to the well;
fit the overlay curve onto the graphics display to generate a fitted overlay curve, wherein the fitted overlay curve is based on a match between one of the plurality of dimensionless decline curves and the flow rate normalized cumulative production curve; and
calculate a reservoir effective drainage area for the well using values that correspond to the fitted overlay curve, the flow rate normalized cumulative production curve, and the one of the plurality of dimensionless decline curves.

18. The system of claim 17, wherein the mathematical model is based on information pertaining to the well.

19. A non-transitory computer-readable medium for characterizing flow production of a well, the computer-readable medium having stored thereon computer-executable instructions which, when executed by a computer, cause the computer to:
generate onto a graphics display a plurality of dimensionless decline curves from a mathematical model that characterizes an expected flow production of the well, wherein:
the plurality of dimensionless decline curves are generated using a plurality of decline analysis functions determined based on a plurality of rate transient functions and an imaging function that correspond to the mathematical model; and
the plurality of decline analysis functions comprise a dimensionless decline cumulative production function and a dimensionless decline flow rate function;
generate onto the graphics display a flow rate normalized cumulative production curve for the expected flow production of the well, wherein the flow rate normalized cumulative production curve is a function of the ratio of the dimensionless decline cumulative production function to the dimensionless decline flow rate function;
generate an overlay curve based on production data pertaining to the well;
fit the overlay curve onto the graphics display to generate a fitted overlay curve, wherein the fitted overlay curve is based on a match between one of the plurality of dimensionless decline curves and the flow rate normalized cumulative production curve; and
calculate a reservoir effective drainage area for the well using values that correspond to the one of the plurality of dimensionless decline curves, the flow rate normalized cumulative production curve, and the fitted overlay curve.

20. A method for characterizing flow production of a well, comprising:
generating onto a graphics display, using a computer, a plurality of dimensionless decline curves from a mathematical model that characterizes an expected flow production of the well;
generating onto the graphics display a flow rate normalized cumulative production curve for the expected flow production of the well, wherein the flow rate normalized cumulative production curve is defined by:

$$\frac{Q_{pDd}}{q_{Dd}} = \frac{2\pi Q_{pD}}{A_D \varepsilon q_{wD}}$$

wherein $Q_{pDd}$ is a dimensionless decline cumulative production, $q_{Dd}$ is a dimensionless decline flow rate, $Q_{pD}$ is a dimensionless rate-transient well cumulative production, $q_{wD}$ is a dimensionless wellbore flow rate, $A_D$ is a dimensionless drainage area, and $\varepsilon$ is an imaging function;
generating an overlay curve based on production data pertaining to the well;
fitting the overlay curve onto the graphics display to generate a fitted overlay curve, wherein the fitted overlay curve is based on a match between one of the plurality of dimensionless decline curves and the flow rate normalized cumulative production curve; and
calculating a reservoir effective drainage area for the well using values that correspond to the fitted overlay curve, the flow rate normalized cumulative production curve, and the one of the plurality of dimensionless decline curves.

* * * * *